(12) United States Patent  
Kasono et al.

(10) Patent No.: US 7,663,124 B2  
(45) Date of Patent: Feb. 16, 2010

(54) BEAM RECORDING METHOD AND DEVICE

(75) Inventors: Osamu Kasono, Tsurugashima (JP); Osamu Kumasaka, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 170 days.

(21) Appl. No.: 11/813,004

(22) PCT Filed: Nov. 22, 2005

(86) PCT No.: PCT/JP2005/021934

§ 371 (c)(1),  
(2), (4) Date: Jun. 28, 2007

(87) PCT Pub. No.: WO2006/070555

PCT Pub. Date: Jul. 6, 2006

(65) Prior Publication Data

US 2008/0093562 A1 Apr. 24, 2008

(30) Foreign Application Priority Data

Dec. 28, 2004 (JP) .............................. 2004-379577

(51) Int. Cl.  
*G11B 9/10* (2006.01)

(52) U.S. Cl. ............................... 250/492.1; 250/396 R; 250/397; 250/400; 250/492.3; 369/53.25; 369/53.28; 369/53.29; 369/100; 369/101

(58) Field of Classification Search ............ 250/396 R, 250/398, 400, 492.1, 492.2, 492.21, 492.22, 250/492.3, 397; 369/101, 99, 53.25, 53.28, 369/53.29; 355/197; 430/296, 297, 298, 430/299

See application file for complete search history.

(56) References Cited

U.S. PATENT DOCUMENTS

| | | | | |
|---|---|---|---|---|
| 4,410,800 A | * | 10/1983 | Yoshikawa | 250/442.11 |
| 5,051,556 A | * | 9/1991 | Sakamoto et al. | 219/121.25 |
| 5,180,920 A | * | 1/1993 | Kai et al. | 250/492.2 |
| 5,465,248 A | * | 11/1995 | Fuji | 369/112.01 |
| 5,654,953 A | * | 8/1997 | Yoshida et al. | 369/275.1 |
| 6,156,464 A | * | 12/2000 | Hada | 430/30 |
| 2003/0034460 A1 | * | 2/2003 | Ono et al. | 250/492.1 |
| 2003/0089858 A1 | * | 5/2003 | Hotta et al. | 250/396 R |
| 2004/0007679 A1 | * | 1/2004 | Viviani | 250/492.21 |
| 2004/0117757 A1 | * | 6/2004 | Inanami et al. | 716/21 |

FOREIGN PATENT DOCUMENTS

| | | |
|---|---|---|
| JP | 63-55935 A | 3/1988 |
| JP | 2000-315637 A | 11/2000 |
| JP | 2002-288890 A | 10/2002 |

* cited by examiner

*Primary Examiner*—Jack I Berman  
*Assistant Examiner*—Nicole Ippolito Rausch  
(74) *Attorney, Agent, or Firm*—Sughrue Mion, PLLC

(57) ABSTRACT

A recording device including a beam deflection section for relatively moving an irradiation position of an exposure beam with respect to a substrate on which a resist layer is formed; a substrate velocity adjustment section for adjusting a moving velocity of the substrate based on a deflection amount of the exposure beam; and a deflection control section for controlling to change a deflection velocity of the exposure beam during exposure of the recording signals according to the moving velocity of the substrate.

21 Claims, 13 Drawing Sheets

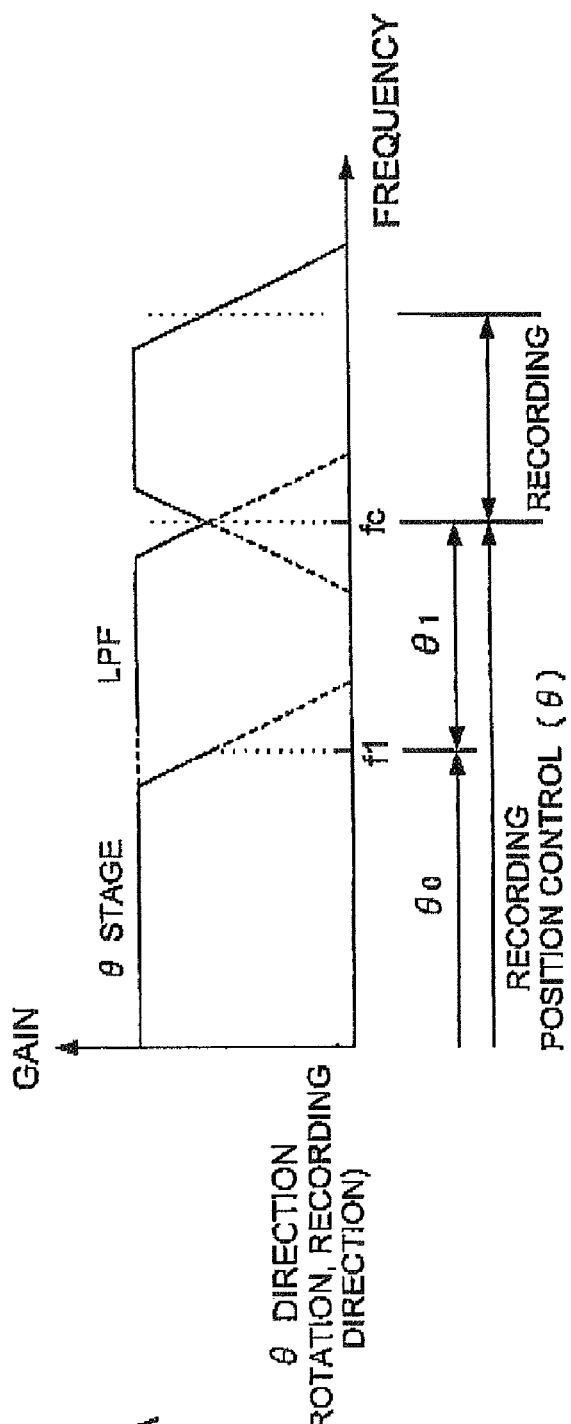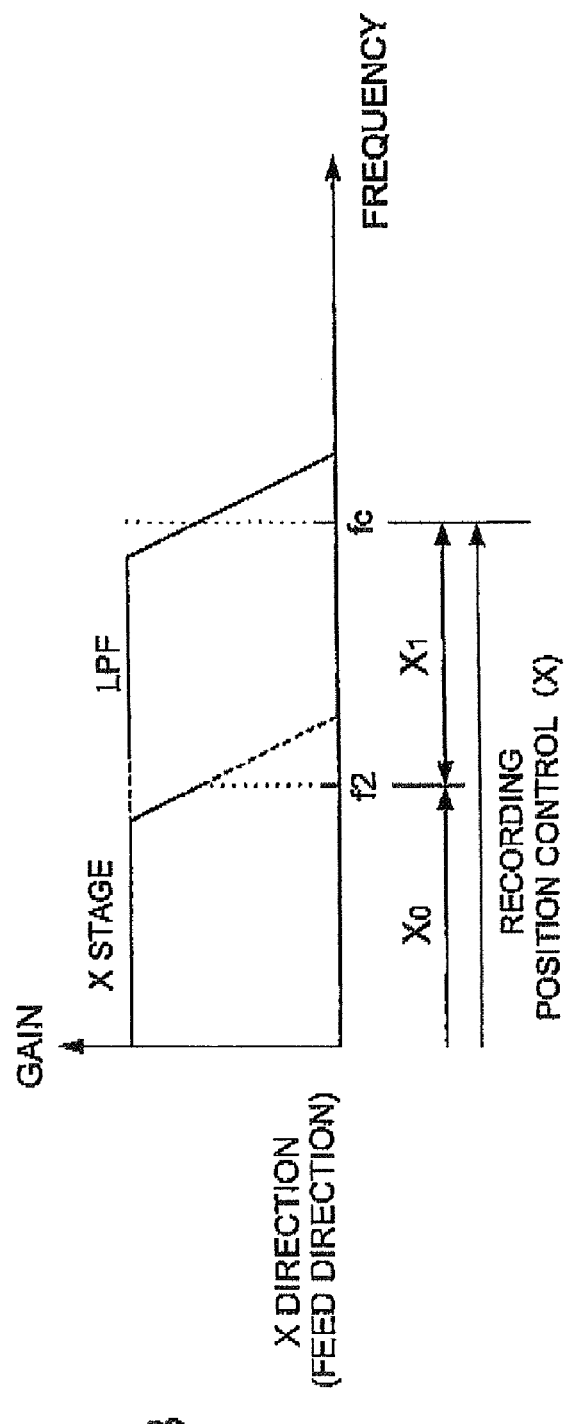
FIG.6A
FIG.6B

BEAM RECORDING METHOD AND DEVICE

TECHNICAL FIELD

The present invention relates to a beam recording device and a recording method using an exposure beam such as an electron beam, laser beam and charged beam, and more particularly to a beam recording device and a recording method for manufacturing a master disk of recording media such as an optical disk and magnetic disc using an exposure beam.

BACKGROUND ART

A beam recording device for performing lithography using such an exposure beam as an electron beam and laser beam has been widely applied to master disk manufacturing devices for large capacity disks, such as optical disks including digital versatile disk (DVD) and Blu-ray disc and the hard disks for magnetic recording.

For example, when such an optical disk is manufactured, a predetermined pattern of pits and projections along a track is formed on the master disk, and a disk stamper is formed from the master disk. Then synthetic resin is hot-pressed or injection-molded using the disk stamper, and metal is deposited on the recording surface where this pattern is transferred from the master disk, then a transparent substrate is formed. The pattern is recorded on the master disk by a bean recording device.

The beam recording device feeds a beam in the radius direction while rotating the master disk substrate surface, so that the beam writes spiral or concentric tracks on the substrate recording surface. Then blanking of the beam is performed so that pits are recorded on the recording surface by turning the beam irradiation on the tracks between ON and OFF states (see Non-Patent Document 1). The pit pattern is also recorded by controlling the deflection of the beam instead of controlling the beam between ON and OFF states (see Patent Document 1).

However if the space sections of the data is provided by blanking of the beam, a loss of beam current is caused. Even when the pit pattern is recorded by controlling the deflection of the beam, defocus is caused if the beam defection becomes large, so blanking must be performed for a long space.

Therefore implementation of a beam recording device having no beam current loss and high throughput has been desired.

[Non-patent Document 1]
"High-Density Recording using an Electron Beam Recorder", Y. Wada et al., Japan Journal of Applied Physics, Vol. 40 (2001), pp. 1653-1660) (page 1655, FIG. 4)

[Patent Document 1]
Japanese Patent Application Laid-Open Publication Kokai No. 2000-315637 (page 3, FIG. 2)

DISCLOSURE OF THE INVENTION

An object of the present invention is to provide a beam recording device and recording method whereby beam current is not lost and precision and throughput are high.

A recording device according to the present invention is a recording device for forming a latent image on a resist layer formed on a substrate by irradiating an exposure beam onto the resist layer in accordance with recording signals while moving the substrate, comprising: a beam deflection section for relatively moving an irradiation position of the exposure beam with respect to the substrate; a substrate velocity adjustment section for adjusting a moving velocity of the substrate based on the deflection amount of the exposure beam: and a defection control section for performing control to change the deflection velocity of the exposure beam during exposure of the recording signals according to the moving velocity of the substrate.

A recording device according to the present invention is a recording device for forming a latent image on a resist layer formed on a substrate by irradiating an exposure beam on the resist layer in accordance with recording signals while moving the substrate, comprising: a beam deflection section for relatively moving an irradiation position of the exposure beam with respect to the substrate; a substrate velocity adjustment section for adjusting a moving velocity of the substrate according to a duty ratio of the recording signals; and a deflection control section for performing control to change the deflection velocity of the exposure beam during exposure of the recording signals according to the moving velocity of the substrate.

A recording method according to the present invention is a recording method forming a latent image on a resist layer formed on a substrate by irradiating an exposure beam on the resist layer in accordance with recording signals while moving the substrate, the method comprising steps of: moving an irradiation position of the exposure beam with respect to the substrate; adjusting a moving velocity of the substrate based on the deflection amount of the exposure beam; and performing control to change the deflection velocity of the exposure beam during exposure of the recording signals according to the moving velocity of the substrate.

A recording method according to the present invention is a recording method for forming a latent image on a resist layer formed on a substrate by irradiating an exposure beam on the resist layer in accordance with recording signals while moving the substrate, the method comprising steps of: relatively moving an irradiation position of the exposure beam with respect to the substrate; adjusting a moving velocity of the substrate according to a duty ratio of the recording signals; and performing control to change the deflection velocity of the exposure beam during exposure of the recording signals according to the moving velocity of the substrate.

BRIEF DESCRIPTION OF THE DRAWINGS

FIG. 6 are diagrams showing a frequency responding band of the $\theta$ stage and X stage, the passing frequency band of the low pass filter and the frequency band for performing recording operation;

BEST MODE FOR CARRYING OUT THE INVENTION

Embodiments of the present invention will now be described in detail with reference to the drawings. In the following embodiments, equivalent composing elements are denoted with a same reference symbols.

Embodiment 1

Figure 1:
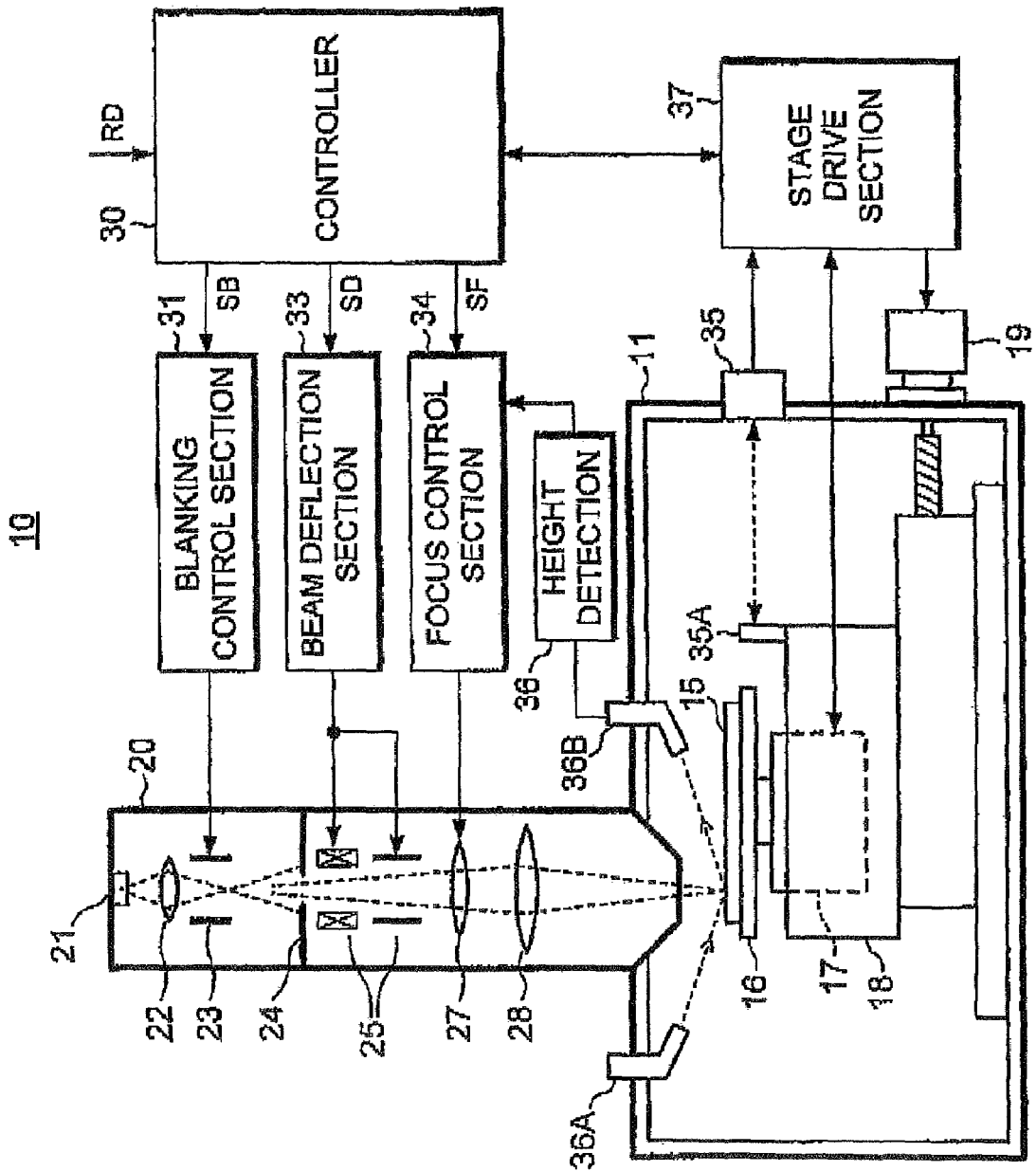
FIG. 1 is a block diagram showing the configuration of the electron beam recording device according to Embodiment 1 of the present invention.

FIG. 1 is a block diagram showing a configuration of an electron beam recording device 10 according to Embodiment 1 of the present inventions. The electron beam recording device 10 is a disk mastering device for creating a master disk for manufacturing an optical disk using an electron beam.

The electron beam recording device 10 comprises a vacuum chamber 11, a drive device for placing a substrate 15 in the vacuum chamber 11 and performing rotational and translational driving, a beam column 20 installed in the vacuum chamber 11, various circuits for performing drive control of the substrate and electron beam control, and a control system.

In more detail, the substrate 15 for a master disk, on which surface resist is coated, is placed on a turntable 16. The turntable 16 is rotationally driven with respect to the vertical axis of the main surface of the disk substrate by a spindle motor 17 as a rotational drive device which rotationally drives the substrate 15. The spindle motor 17 is installed on a feed stage (hereinafter, also referred to as X stage) 18. The X stage 18 is connected to a feed motor 19 which is a transporting (translational moving) device, so as to move the spindle motor 17 and the turntable 16 in a predetermined direction (x direction) in a plane which is parallel to the main surface of the substrate 15. Therefore the X stage 18, the spindle motor 17 and the turntable 16 constitute an Xθ stage.

The spindle motor 17 and the X stage 18 are driven by a stage drive section 37, and a feed amount of the X stage 18, which is the drive amount thereof, and the rotation angle of the turntable 16 (that is substrate 15) are controlled by a controller 30.

The turntable 16 is made of a dielectric material, such as ceramic, and has an electrostatic chucking mechanism (not illustrated). The electrostatic chucking mechanism is comprised of a turntable 16 (ceramic) and an electrode that is a conductor for generating electrostatic polarization provided in the turntable 16. A high voltage power supply (not illustrated) is connected to the electrode, and the substrate 15 is held by suction by applying voltage to the electrode from the high voltage power supply.

On the X stage 18, a reflecting mirror 35A, which is a portion of a laser interferometer 35, exists.

The vacuum chamber 11 is installed via a vibration isolation table (not illustrated), such as an air damper, for suppressing the transfer of external vibration. A vacuum pump (not illustrated) is also connected to the vacuum chamber 11, and by exhausting inside the chamber using the pump, the inside of the vacuum chamber 11 becomes a predetermined pressure of vacuum atmosphere.

In the electron beam column 20, an electron gun (emitter) 21 for emitting an electron beam, a condenser lens 22, blanking electrodes 23, an aperture 24, beam deflection electrodes 25, a focus lens 27 and an objective lens 28 are provided in this sequence. An alignment electrode for correcting the position of the electron beam based on the beam position correction signal from the controller 30 is also included.

The electron gun 21 emits an electron beam (EB) accelerated to several tens KeV by a cathode (not illustrated) to which high voltage, supplied from an accelerating high voltage power supply (not illustrated), is applied. The condenser lens 22 converges the emitted electron beam. The blanking electrodes 23 perform ON/OFF switching of the electron beam based on modulation signals from the blanking control section 31. In other words, passing of the electron beam through the aperture 24 is blocked by greatly deflecting the electron beam that passes by applying a voltage between the blanking electrodes 23, so as to turn the electron beam in the OFF state.

The beam deflection electrodes 25 can perform deflection control of the electron beam at high-speed based on control signals from a beam deflection section 33. By this deflection control, the position of the electron beam spot, with respect to the substrate 15, is controlled. The focus lens 28 is driven based on a drive signal from a focus control section 34 to perform focus control of the electron beam.

In the vacuum chamber 11, a light source 36A and a photo-detector 36B for detecting the height of the surface of the substrate 15 are provided. In the electron beam recording device 10, a height detection section 36 is provided. The photo-detector 36B, which includes a position sensor and a CCD (Charge Coupled Device), receives an optical beam which is emitted from the light source 36A which is reflected by the surface of the substrate 15, and supplies the light receiving signal to the height detection section 36. The height detection section 36 detects the height of the surface of the substrate 15 based on the light receiving signal, and generates a detection signal. The detection signal to indicate the height of the surface of the substrate 15 is supplied to the focus control section 34, and the focus control section 34 controls the focus of the electron beam based on the detection signal.

The laser interferometer 35 measures a distance to the X stage 18 using the laser beam for distance measurement emitted from a light source in the laser interferometer 35, and sends the distance measurement data, that is the feed (X direction) position data of the X stage 18, to the stage drive section 37. A rotation signal of the spindle motor 17 is sent to the stage drive section 37. The rotation signal includes a rotation synchronization signal to indicate a reference rotation position of the substrate 15 and a pulse signal from the reference rotation position for each predetermined rotation angle. The stage drive section 37 acquires the rotation angle, the rotation velocity and the rotation frequency of the substrate 15 by the rotation signal.

The stage drive section 37 generates position data to indicate a position of the electron beam spot on the substrate based on the feed position data from the X stage 18 and the rotation signal from the spindle motor 17, and supplies it to the controller 30. The stage drive section 37 also drives the spindle motor 17 and the feed motor 19 based on the control signals from the controller 30 to perform rotation and feed (Xθ stage) driving. The case of having the Xθ-stage was described here, but an XY stage may be used so that the stage drive section 37 drives the XY-stage and controls the X and Y positions of the beam spot.

Information data to be recorded (recording data) RD is supplied to the controller 30. The recording data RD is modulation data used for disk recording, such as modulated data by 8/16 modulation in the case of a DVD, for example. Although the case when the recording data is digital signals will be described below, but the present invention can also be applied to the case when the recording data is not pure digital signals. For example, the present invention can also be applied to a recording format when such a modulation as FM and AM are performed on carrier signals, and mastering is performed with waveforms after they have passed through a limiter circuit, such as a conventional analog laser disk recording format.

The controller 30 sends a blanking control signal SB, a deflection control signal SD and a focus control signal SF to the blanking control section 31, the beam deflection section 33 and the focus control section 34 respectively, and performs recording (exposure or writing) control. In other words, the electron beam is irradiated to the resist on the substrate 15 based on the recording data, and a latent image corresponding to the recording pits is formed only on an area exposed by irradiation of the electron beam to record data.

The recording control is performed based on the above mentioned feed position data and rotation position data. The major signal lines related to the blanking control section 31, the beam deflection section 33, the focus control section 34 and the stage drive section 37 were shown, but each composing element is bi-directionally connected with the controller 30, so that necessary signals can be transmitted and received.

Now the case of recording the pit pattern of an optical disc using the electron beam recording device 10 (electron beam exposure) will be described.

First a principle of pit pattern recording operation will be described. FIG. 2 shows diagrams illustrating the deflection amount of an electron beam (EB) when electron beam writing is performed while the linear velocity of the substrate is held constant. To make understanding easier, the electron beam column 20 moves relative to the movement of the substrate. The deflection amount of the electron beam is shown exaggerated.

The substrate 15 moves at the linear velocity Vsub (hereafter referred to as substrate velocity) (in the left direction in FIG. 2), and the deflection velocity Vbeam of the electron bean (EB) when each pit is recorded is defined so that the recording velocity (or exposure velocity) Vexp becomes constant. In other words, the relative velocity of the substrate velocity Vsub and the deflection velocity Vbeam of the electron beam are controlled to maintain the relationship of Vexp=Vsub−Vbeam, so as to be appropriate for the recording of pits. In the space sections, the blanking of the electron beam is not performed, but high-speed deflection is performed so that the beam is moved instantaneously to the next pit recording position.

The relative velocity (or recording velocity) Vexp of the substrate velocity Vsub and the beam deflection velocity Vbeam need not be strictly constant. An appropriate recording velocity differs depending on the conditions of lithography, such as the resist sensitivity, the layer thickness, the environment temperature, and has a predetermined tolerance. The tolerance also differs depending on such recording conditions as the width of a pit and track pitch. Therefore the relative velocity Vexp may fluctuate within a range which satisfies the above mentioned conditions.

Figure 2A:
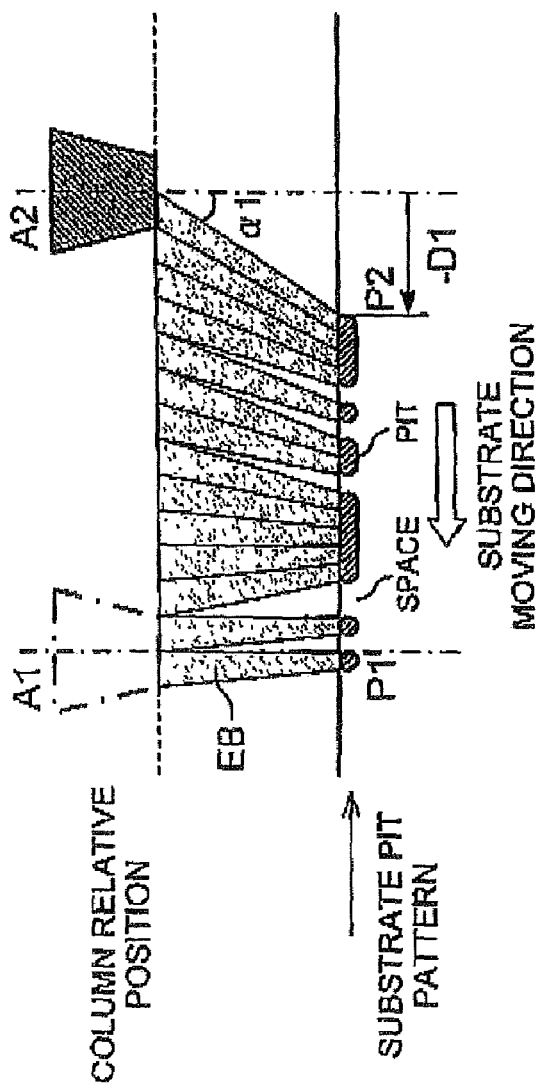
FIG. 2 are diagrams showing the deflection amounts of the electron beam (EB) then electron beam writing is performed with the linear velocity of the substrate as constant.

FIG. 2A shows the case when a pit pattern, where pits of the recording data (modulation data) is dense (duty ratio of pits is large), is recorded. When the pit pattern is recorded from the position P1 to position P2, the electron beam column 20 moves from the relative position A1 to the relative position A2. Since the duty ratio of the pits is large, the recording position shifts backward (i.e., the moving direction of the substrate 15) from the column position, and the beam deflection amount W at the recording position P2 becomes −D1 and the deflection angle becomes α1. The deflection amount W of the beam and the deflection angle α are defined with reference to a predetermined irradiation position, such as a position where the beam is irradiated vertically to the substrate.

Figure 2B:
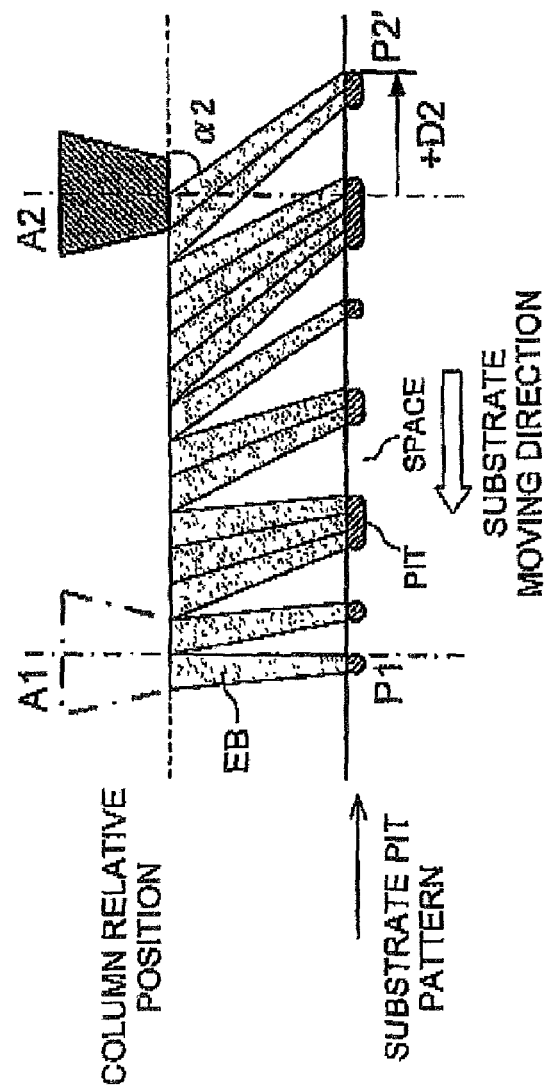

On the other hand, if the pits of the recording data are not dense (duty ratio of pits is small), as shown in FIG. 2B, the recording positions shift forward (i.e., direction opposite to the direction of the movement of the substrate 15) from the column direction when the column position moves from A1 to A2, and the deflection amount of the beam becomes +D2 and the deflection angle becomes α2 at the recording position P2'. If the deflection amount (D1, D2) becomes large in this way, the deflection angle (α) of the beam with respect to the substrate increases, which results in deterioration of the beam convergence characteristic such as the increase of the diameter of the beam spot or the deformation thereof, and recording accuracy deteriorates.

Figure 3:
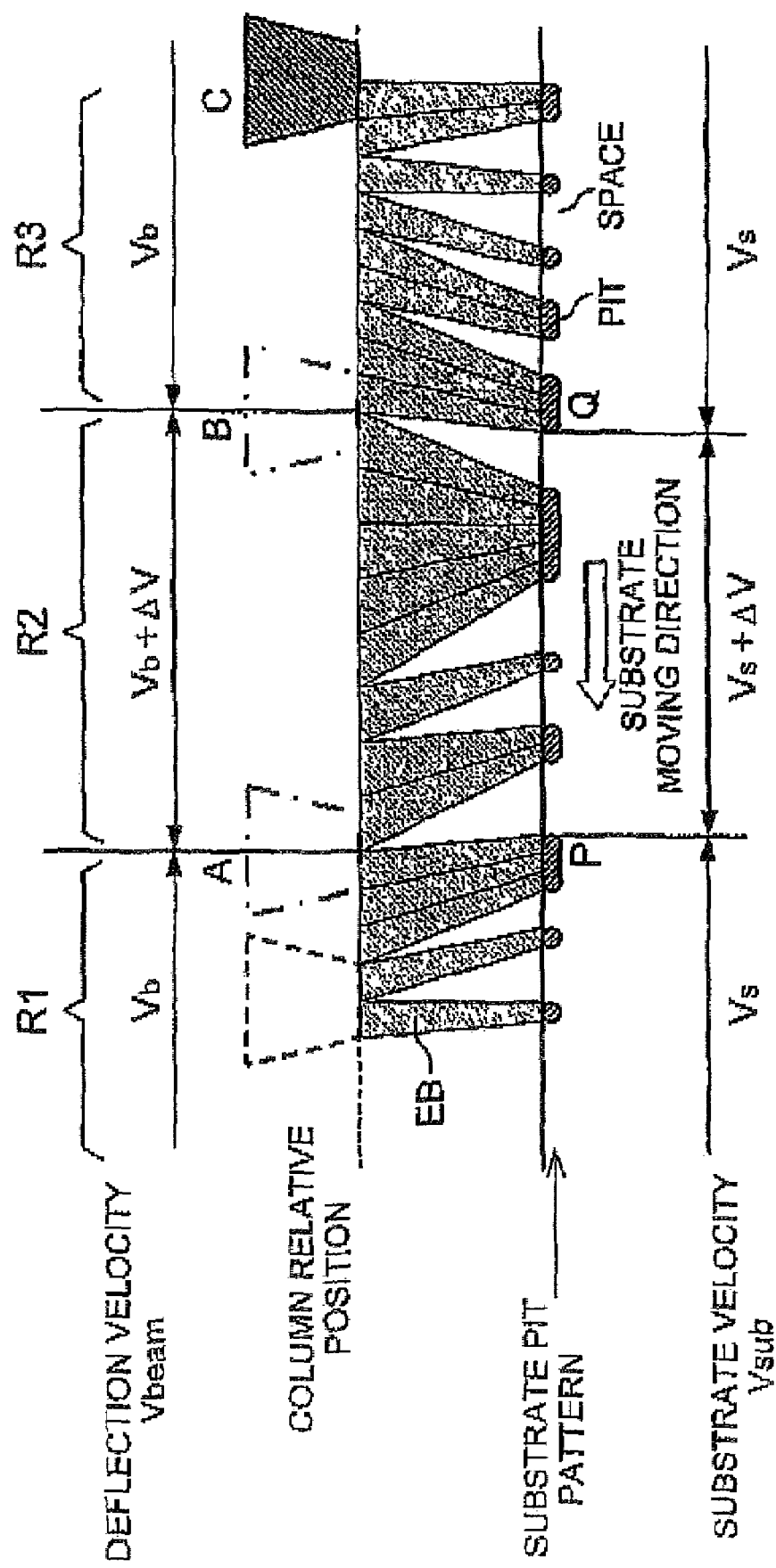
FIG. 3 is a diagram showing the principle of recording control according to Embodiment 1.

FIG. 3 is a diagram showing the principle of the recording control. In the successive recording sections or blocks R1, R2 and R3, the case where the duty ratio of the pits is smaller than a predetermined value (i.e., pits are not dense) in the recording block R2, that is the ratio of the pit portions to the space portions in this recording block is less than a predetermined value, is shown.

In the recording block R1 in which the duty ratio of the pits is within a predetermined range, recording is performed at the substrate velocity Vsub=Vs, and the deflection velocity Vbeam=Vb. The velocity difference Vsub−Vbeam=Vs−Vb is controlled to be the recording velocity Vexp (that is Vsub−Vbeam=Vexp). In the recording block R2 in which the duty ratio of the pits is small, the substrate velocity and the deflection velocity are increased by ΔV respectively (ΔV>0). In other words, Vsub=Vs+ΔV and Vbeam=Vb+ΔV, and the pit recording velocity Vexp does not change since the substrate velocity and the deflection velocity are changed by the same velocity (ΔV). In other words, the relationship Vsub−Vbeam=(Vs+ΔV)−(Vb+ΔV)=Vexp is still maintained in the recording block R2.

In the recording block R3, control is performed to be the substrate velocity Vsub=Vs and the deflection velocity Vbeam=Vb just like the case of the recording block R1.

If the duty ratio of the pits is greater than a predetermined value (i.e., pits are dense) in the recording block R2, contrary to the case of FIG. 3, in other words, if the ratio of the pit portions to the space portions in the block exceeds a predetermined value, the substrate velocity Vsub and the deflection velocity Vbeam are decreased by the same velocity ΔV in the block R2, that is ΔV<0 in the above expressions Vsub=Vs+ΔV and Vbeam=Vb+ΔV.

Figure 4:
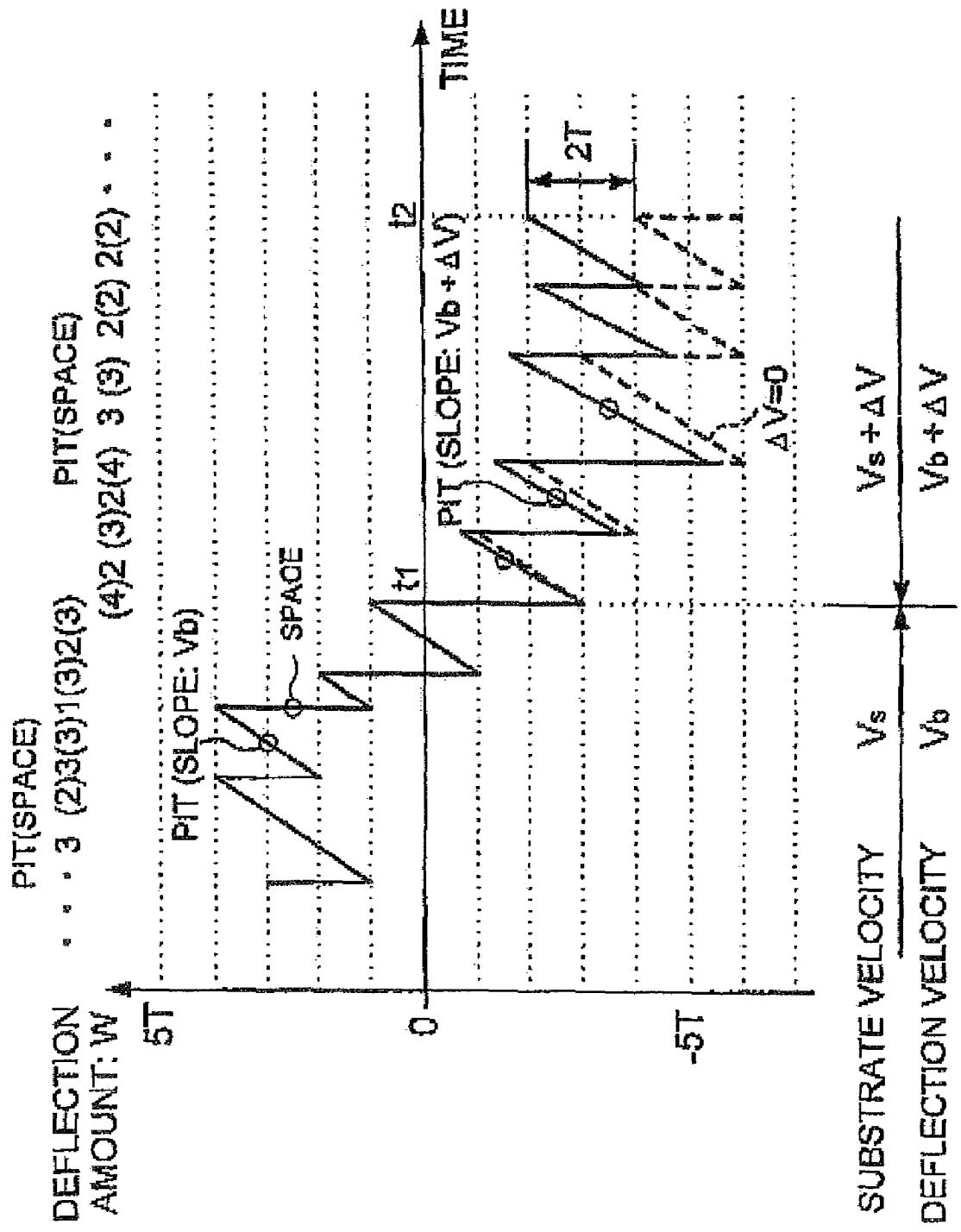
FIG. 4 is a diagram showing a change of beam deflection amount (W) when the velocity change ($\Delta V$) is applied to the substrate velocity Vsub and deflection velocity Vbeam.

FIG. 4 is a diagram showing a change of the beam deflection amount (W) when the velocity change (ΔV) is applied to the substrate velocity Vsub and the deflection velocity Vbeam. The slope sections in FIG. 4 are corresponding to the pit recording sections, and the slope thereof indicates the beam deflection velocity Vbeam. The vertical sections in FIG. 4 correspond to the space sections where beam deflection is performed at high-speed, and exposure (recording) is not performed. The data sequences of bits and spaces in the recording data are indicated by "pit" and "space". Specifically, in the recording data sequence up to time t1 in FIG. 4, a pit and a space are alternately linked in a contiguous sequence as 3T, 2, 3T, 3T, 1T, 3T, 2T, 3T (T is a pit length unit), which is shown as " . . . 3 (2) 3 (3) 1 (3) 2 (3)" in FIG. 4. The recording sequence in the time period t1 to t2 is indicated in the same way as "(4) 2 (3) 2 (4) 3 (3) 2 (2) 2 (2) . . . .

This shows the case when no velocity change is applied (i.e., ΔV=0) in the block up to time t1, and the velocity change (ΔV) is applied to the substrate velocity Vsub and the deflection velocity Vbeam (solid line) in the block (the time period t1 to t2) where the duty ratio of the pit pattern is small. The broken line shows the case when a velocity change is not applied in the period t1 to t2. As this shows, the substrate velocity Vsub and the deflection velocity Vbeam are increased in the recording block after time t1, where the velocity change (ΔV>0) is applied, and the deflection amount adjustment of 2T is performed at time t2.

As described above, the beam deflection amount during pit recording (exposure) changes according to the duty ratio of the pit pattern. More specifically, the electron beam is deflected to the next pit recording position at high-speed in the space section after recording of one pit is finished, but if data sections having large duty ratios continue, the deflection amount W (or deflection angle α) of the beam accumulates. In other words, as FIG. 4 shows, the recording start position and the end position (that is the deflection start position and the end position) sequentially shift every time beam recording is performed, and the value of the deflection of the beam increases cumulatively. This is the same for the case of continuing data sections having small duty ratios. However, by applying the velocity change (ΔV) to the substrate velocity Vsub and the deflection velocity Vbeam, the beam deflection amount (or deflection angle) which increases cumulatively can be decreased so as to be within a predetermined range. In the description below, the beam deflection amount, which accumulates as pits are recorded, is referred to as the "cumulative deflection amount" or the "deflection amount integral value".

In other words, adjustment is performed so that the substrate moves with respect to the column at an appropriate relative velocity according to the duty ratio in the pit pattern or the beam deflection accumulating amount, thus excess of the beam deflection amount and deterioration of the convergence characteristics of the beam can be avoided. In the above description, the case when the velocity change (ΔV) is constant was illustrated and explained, to make understanding easier, but the velocity change ΔV is not necessarily constant. In other words, control can be performed so as to adjust the change of the substrate velocity Vsub and the deflection velocity Vbeam (change of ΔV) continuously.

The principle of control for adjusting the deflection amount by changing the substrate Vsub and the deflection velocity Vbeam was described above, but various controls can be performed using the above principle.

Figure 5:
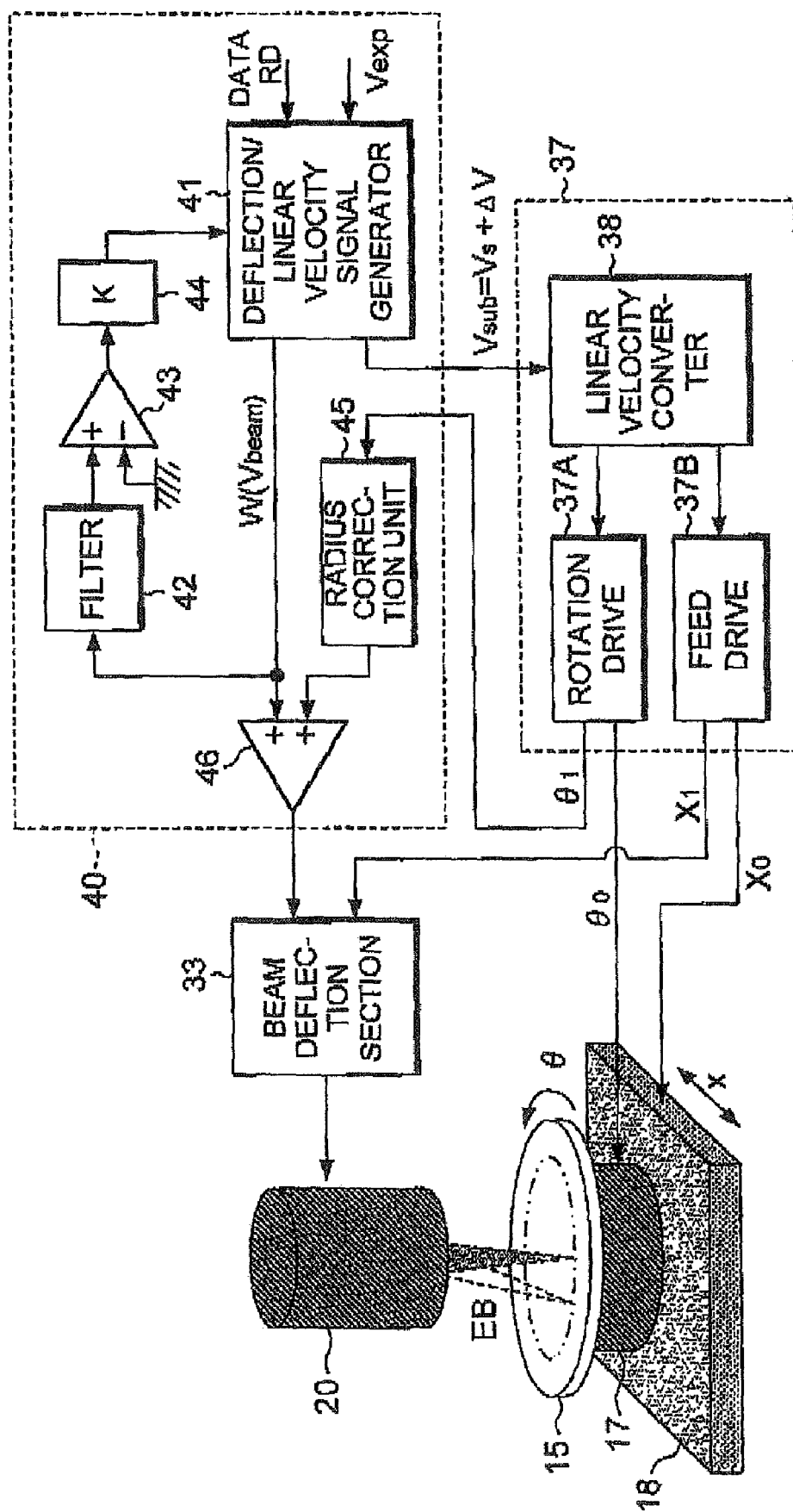
FIG. 5 is a block diagram showing an example of the detailed configuration of the control system according to Embodiment 1.

FIG. 5 is a block diagram showing an example of the detailed configuration of the control system according to the present embodiment, where the portion of the control system for performing deflection control of the beam and the position control of the substrate 15 is shown in detail.

According to the recording control of the present embodiment, the recording control is performed while changing the deflection velocity and the substrate velocity (linear velocity) continuously without separating the recording sections or blocks. Specifically, the deflection amount is adjusted while changing the substrate velocity Vsub and the deflection velocity Vbeam according to the beam deflection amount when the recording data (that is the information data to be recorded) RD is recorded.

More specifically, in the controller 30, which operates as a system controller for controlling the entire electron beam recording device 10, a deflection/linear velocity control section 40 is provided. The deflection/linear velocity control section 40 has a deflection/linear velocity signal generator 41 for generating a beam deflection signal and linear velocity signal. In the deflection/linear velocity control section 40, a feedback loop comprised of a low-pass filter (LPF) 42, a comparator 43 and an amplifier 44, a radius correction unit 45 and an adder 46 are provided. A band-pass filter (BPF) may be used instead of the low-pass filter 42.

The deflection/linear velocity signal generator 41 generates a beam deflection signal W for specifying a beam deflection amount and a substrate linear velocity signal Vsub for specifying a linear velocity of a substrate are generated based on the recording data RD and the recording (exposure) linear velocity Vexp. To make description easier, signals to indicate the beam deflection amount W, the substrate linear velocity Vsub and the recording linear velocity Vexp are described denoting the same reference symbols, respectively.

In the present embodiment, the deflection/linear velocity control section 40 has a low pass filter circuit for generating the DC neighborhood component of the signal which indicates the deflection amount of the electron beam, so as to adjust the moving velocity of the substrate according to the value of the DC neighborhood component value. More specifically, in the feedback loop, the low pass filter 42 extracts components that are not more than the high cut-off frequency (fc) out of the beam deflection signal W. The low frequency component signal after passing through the low pass filter 42 is compared with a predetermined target value (e.g. 0) by the comparator 43. The comparison result, that is the difference signal from the target value, is amplified by the amplifier 44, and is fed back to the deflection/linear velocity signal generator 41. The deflection/linear velocity signal generator 41 controls the beam deflection amount W (Vbeam) and the substrate linear velocity Vsub so that the difference signal of the low frequency component becomes a target value. As described above, control is performed so that the pit recording velocity Vexp does not change, in other words, so that the relationship Vsub−Vbeam=Vexp is maintained. The target value can be a zero beam deflection angle (corresponds to the state where the beam impinges the disk vertically), for example.

The substrate linear velocity signal Vsub is supplied to a linear velocity converter 38 provided in the stage drive section 37. The linear velocity converter 38 separates the substrate linear velocity signal Vsub into a θ component and an X component, and supplies the components to a rotation drive section 37A and a feed (X direction) drive section 37B, respectively.

The Xθ stage system, including the spindle motor 17 and the X stage 18, has a out-off frequency for mechanical response. FIG. 6 are diagrams showing the frequency responding bands of the θ stage and the X stage, the passing frequency band of the low pass filter (LPF) 42 and the frequency band for performing the recording operation. The cut-off frequencies for mechanical response of the θ stage and the X stage are f1 and f2 respectively, and the high cut-off frequency of the filter 42 is fc. In other words, in the threshold frequencies of the θ stage and the X stage or less, the Xθ stage system is mechanically capable of responding. Therefore the rotation drive section 37A and the feed drive section 37B drives the spindle motor 17 and the X stage 18 by the rotation component (θ0) and the feed component (X0), which are not more than the threshold frequencies f1 and f2, respectively, out of the θ component and the X component of the linear velocity signal Vsub of the substrate. The rotation component (θ1) and the feed component (X1), which are the residual components exceeding the threshold frequencies (f1, f2), are supplied to a radius correction unit 45 and a beam deflection unit 33, respectively. In the radius correction unit 45, the correction signal for the radius position of the bean is generated, and the correction signal is added to the beam deflection signal from the deflection/linear velocity signal generator 41 in the adder 46, and is supplied to the beam deflection section 33. In other words, the residual error components of the mechanical system (i.e., Xθ stage system) of which operation band is narrow is added to the beam deflection signal via feed forward, and is corrected by deflecting the beam. The frequency of not less than the out-off frequency (fc) of the low pass filter (LPF) 42 is used for pit recording.

By performing the control to adjust the substrate velocity Vsub and the deflection velocity Vbeam so that the signal, which passes through the low pass filter (LPF) 42, becomes the target value with respect to the beam deflection amount W, the substrate is moved at an appropriate relative velocity with respect to the electron beam column according to the beam deflection amount W, and feedback control is performed so that the beam deflection amount W approaches the target value. By this control, deterioration of the convergence characteristics due to the increase of the beam deflection amount and the blanking of the electron beam can be avoided.

As mentioned above, the recording control is performed while changing the beam deflection velocity and the substrate velocity (linear velocity). By the beam deflection control and rotation and feed control of the substrate, the blanking of the electron beam can be minimized, the loss of the electron beam can be decreased, and the throughput of electron beam exposure can be improved.

A beam recording device using an electron beam was described, but the present invention can also be applied to laser beam recording devices having a deflection device, or other charged particle beam recording devices. The beam recording device is not limited to beam recording devices using an Xθ stage system, but the present invention can also be applied to a beam recording device having an XY stage system.

Embodiment 2

Figure 7:
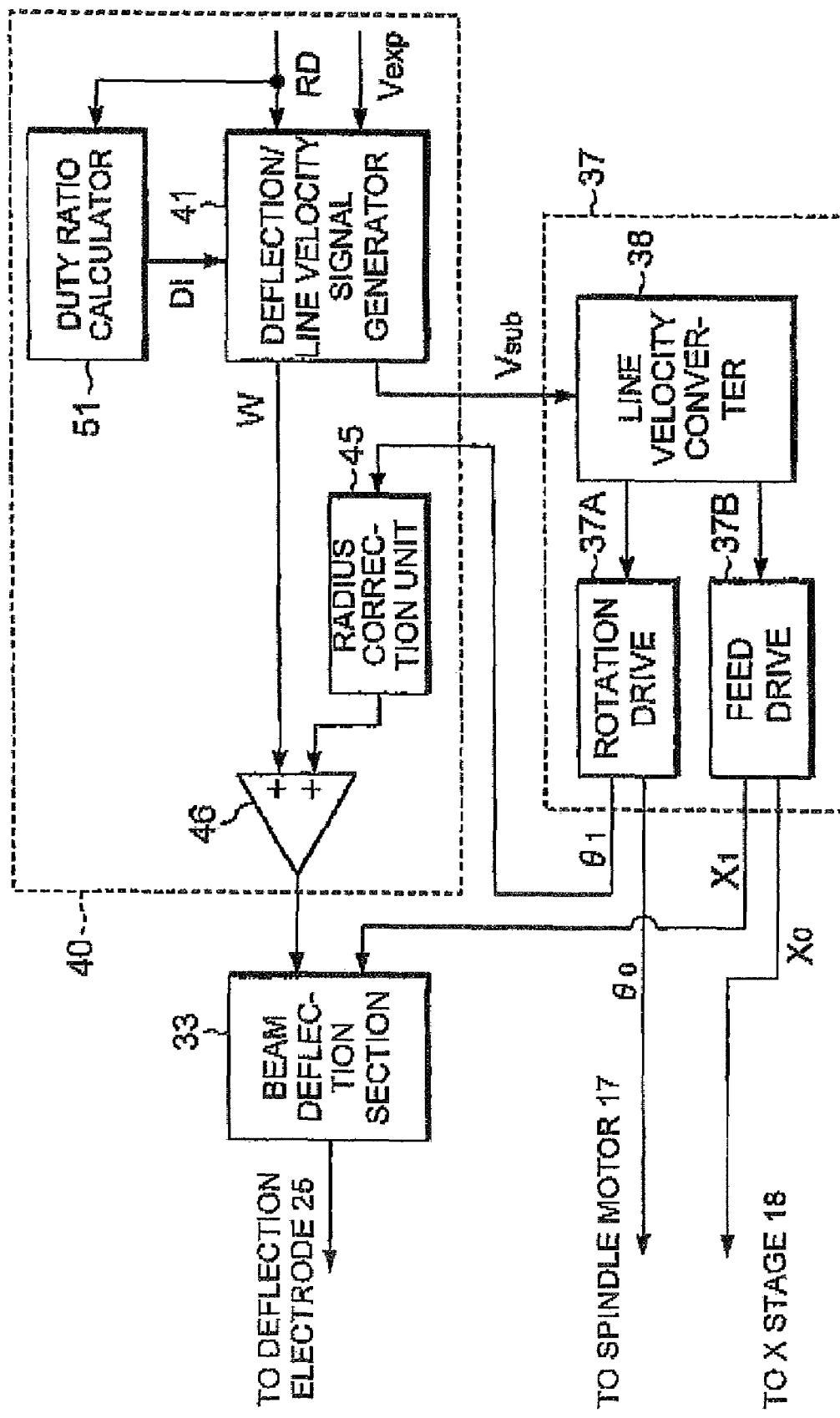
FIG. 7 is a block diagram showing an example of a detailed configuration of the control system according to Embodiment 2.

FIG. 7 is a block diagram showing an example of the detailed configuration of the control system according to Embodiment 2, and the portion of the control system for performing deflection control of the beam and the position control of the substrate 15 is shown in detail.

A deflection/linear velocity control section 40 is provided in the controller 30. A duty ratio calculator 51 is provided in the deflection/linear velocity control section 40. The rest is the same as the configuration shown in FIG. 5.

The duty ratio calculator 51 monitors the information data (recording data) RD to be recorded, calculates the duty ratio DI of the recording data RD, and supplies the duty ratio DI to a deflection/linear velocity signal generator 41. The deflection/linear velocity generator 41 determines the beam deflection velocity Vbeam and the substrate velocity Vsub based on the duty ratio DI. In other words, the adjustment value (ΔV) of the beam deflection velocity Vbeam and the substrate velocity Vsub is calculated. Then based on the calculation result, the beam deflection signal W and the substrate linear velocity signal Vsub are generated.

More specifically, the duty ratio calculator 51 loads the recording data RD and calculates the duty ratio of the data sequence in the recording data RD. For example, the duty ratio calculator 51 loads a predetermined number of pits in the recording data RD, or loads data for each data sequence in a predetermined period, and calculates the duty ratio of the data sequence. The deflection/linear velocity signal generator 41 calculates the beam deflection velocity Vbeam and the substrate velocity Vsub based on the duty ratio DI. This control is performed so that the relationship Vsub−Vbeam=Vexp is maintained, which is the same as the above mentioned embodiment.

Figure 8:
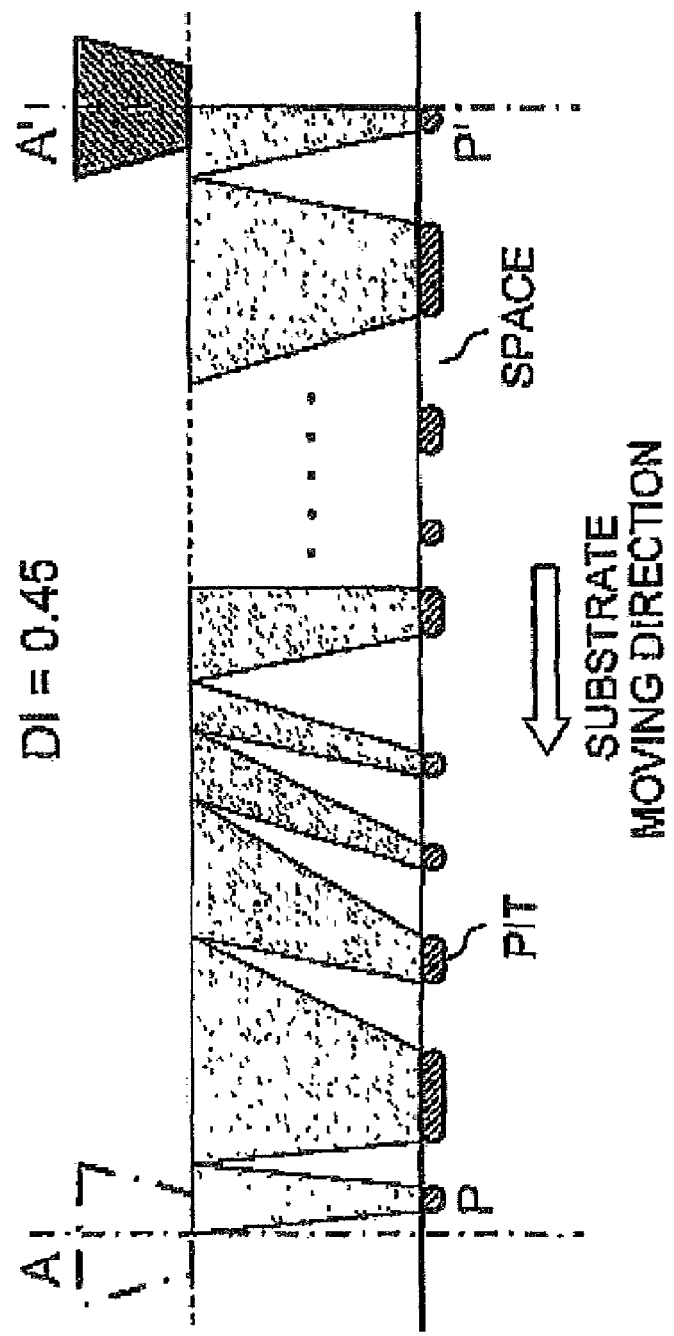
FIG. 8 is a diagram showing an example of calculating the beam deflection velocity Vbeam and the substrate velocity Vsub based on the duty ratio DI in the case when the duty ratio is small in a predetermined block.
Figure 9:
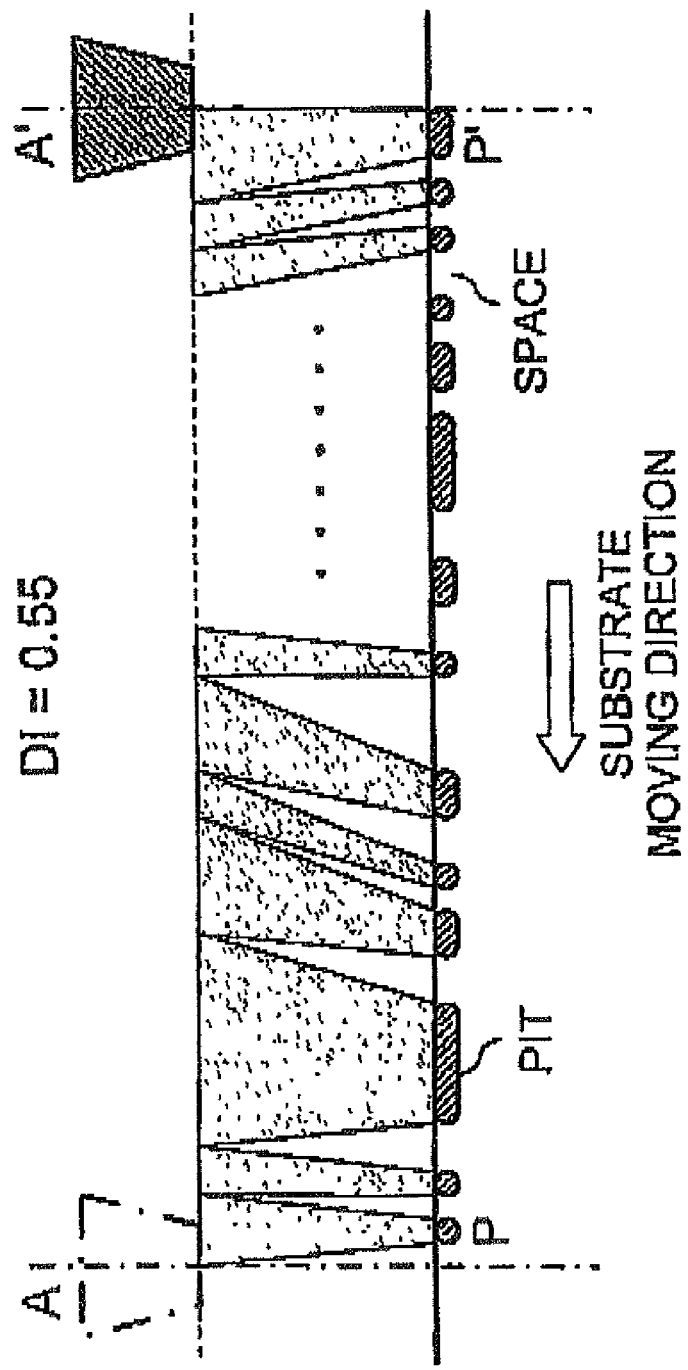
FIG. 9 is a diagram showing an example of calculating the beam deflection velocity Vbeam and the substrate velocity Vsub based on the duty ratio DI in the case when the duty ratio is large in a predetermined block.

FIG. 8 and FIG. 9 are diagrams showing an example of the beam deflection velocity Vbeam and the substrate velocity Vsub, that is ΔV, is calculated based on the duty ratio DI in a predetermined block. FIG. 8 shows a case when the duty ratio is small (DI=0.45), and FIG. 9 shows a case when the duty ratio is large (DI=0.55).

The duty ratio calculator 51 calculates the pit duty ratio in the predetermined block of the recording data RD. The deflection/linear velocity signal generator 41 calculates the substrate velocity Vsub and the beam deflection velocity Vbeam based on the calculated duty ratio DI. For example, the following expression is used for the calculation.

$$Vsub = 1/DI \times Vexp$$

$$Vbeam = Vsub - Vexp = (1-DI)/DI \times Vexp$$

If the duty ratio is 0.5, then Vsub=2×Vexp and Vbeam=1× Vexp. Therefore, when the calculated duty ratio is small (DI=0.45), Vsub=2.22×Vexp and Vbeam 1.22×Vexp, and thus ΔV=0.22 Vexp (>0) is added to the substrate velocity Vsub and the beam deflection velocity Vbeam. In other words, the control is performed so that the velocities are increased.

When the calculated duty ratio is large (DI=0.55) (FIG. 9), on the other hand, Vsub=1.82×Vexp and Vbeam=0.82×Vexp, thus ΔV=−0.18 Vexp (<0) is added to the substrate velocity Vsub and the beam deflection velocity Vbeam. In other words, the control is performed so that the velocities are decreased.

ΔV may be changed discretely according to the duty ratio. For example, the duty ratio calculator 51 determines whether the duty ratio in the predetermined block of the recording data RD is within a predetermined range. In other words, the duty ratio calculator 51 determines whether the duty ratio is equal to or less than the lower limit (W1) of the predetermined range, or the duty ratio exceeds the upper limit (W2) of the predetermined ranges. If the duty ratio is within the predetermined range, the duty ratio DI=W0, to indicate that the duty ratio is within the range, is supplied, if the duty ratio is the lower limit of the predetermined range or less (data is not dense), DI=W1 is supplied, and if the duty ratio exceeds the upper limit of the predetermined range (data is dense), DI=W2 is supplied to the deflection/linear velocity signal generator 41. Using the supplied duty ratio DI as a selection signal, the deflection/linear velocity signal generator 41 selects a velocity adjustment value (ΔV) from the low velocity ΔVL (in the case of DI=W2), the mid-velocity ΔVM (in the case of DI=W0), and high velocity ΔVH (in the case of DI=W1). Here, ΔVL<ΔVM<ΔVH. Based on the velocity adjustment value (ΔV) selected in this way, the beam deflection signal W and the substrate linear velocity signal Vsub are generated. The control is performed so that the relationship Vsub−Vbeam=Vexp is maintained, which is the same as the above mentioned embodiments.

By this control, blanking of the electron beam can be minimized, loss of the electron beam can be decreased, and the throughput of the electron beam exposure can be improved. Also the recording data RD is loaded and the duty ratio of the data sequence is acquired, no beam deflection can be controlled at high precision, and throughput can be greatly improved.

Embodiment 3

Figure 10:
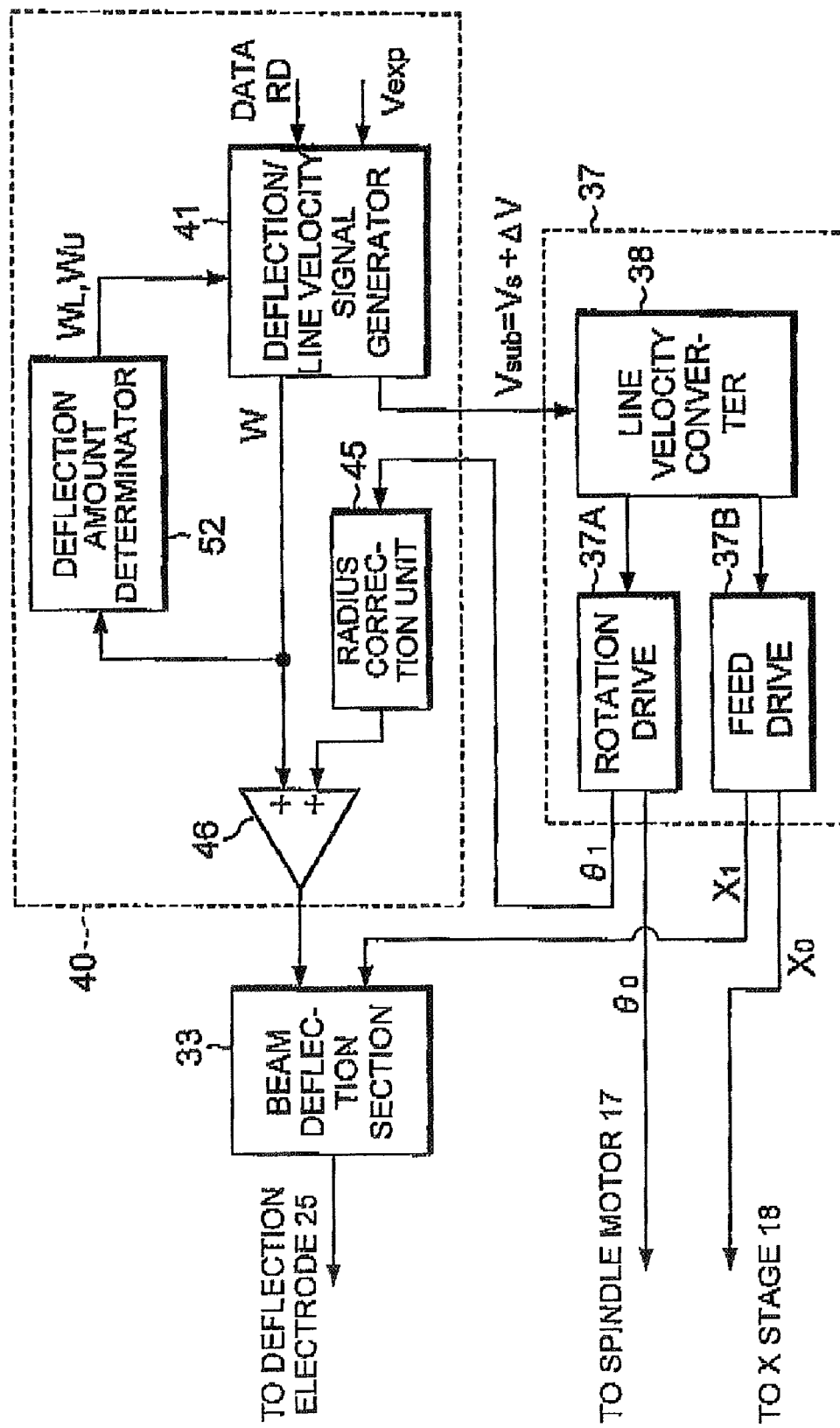
FIG. 10 is a block diagram showing an example of a detailed configuration of the control system according to Embodiment 3.

FIG. 10 is a block diagram showing an example of the detailed configuration of the control system according to Embodiment 3, and the portion of the control system for performing deflection control of the beam and position control of the substrate 15 is shown in detail. The deflection/linear velocity control section 40 is provided in the controller 30, which is the same as the above mentioned embodiments.

In the present embodiment, a deflection amount determination unit 52 is provided in the deflection/linear velocity control section 40. The deflection amount determination unit 52 monitors a beam deflection signal W which is output from the deflection/linear velocity signal generator 41, and determines whether the beam deflection amount is within a predetermined range. The deflectin amount determination unit 52 supplies an upper limit deflection amount signal WU if the deflection amount exceeds the upper limit deflection amount, and supplies a lower limit deflection amount signal WL if the deflection amount is lower than the lower limit deflection amount, to the deflection/linear velocity signal generator 41. Here the absolute values of the upper limit deflection amount and the lower limit deflection amount are set to be smaller than the beam deflection amount (absolute value) at which blanking of the beam is required.

If the upper limit deflection amount signal WU and the lower limit deflection amount signal WL are not received, the deflection/linear velocity signal generator 11 generates the beam deflection signal W and the substrate linear velocity signal Vsub with the velocity adjustment value (ΔV) as the mid-velocity value ΔVM. If the upper limit deflection amount signal WU is received, the deflection/linear velocity signal generator 41 switches the velocity adjustment value (ΔV) to the low velocity value ΔVL, and if the lower limit deflection amount signal WL is received, the deflection/linear velocity signal generator 41 switches the velocity adjustment value (ΔV) to the high velocity value ΔVH. Here ΔVL<ΔVM<ΔVH. The deflection/linear velocity signal generator 41 generates the beam deflection signal W and the substrate linear velocity signal Vsub based on the velocity adjustment value (ΔV). The control is performed so that the relationship Vsub−Vbeam=Vexp is maintained, which is the same as the above mentioned embodiments.

By this control, blanking frequency when the blanking of the electron beam is required can be decreased, loss of the electron beam can be decreased, and the throughput of the electron beam exposure can be improved. Also a recording device with high throughput can be provided with a simple circuit configuration.

Embodiment 4

Figure 11:
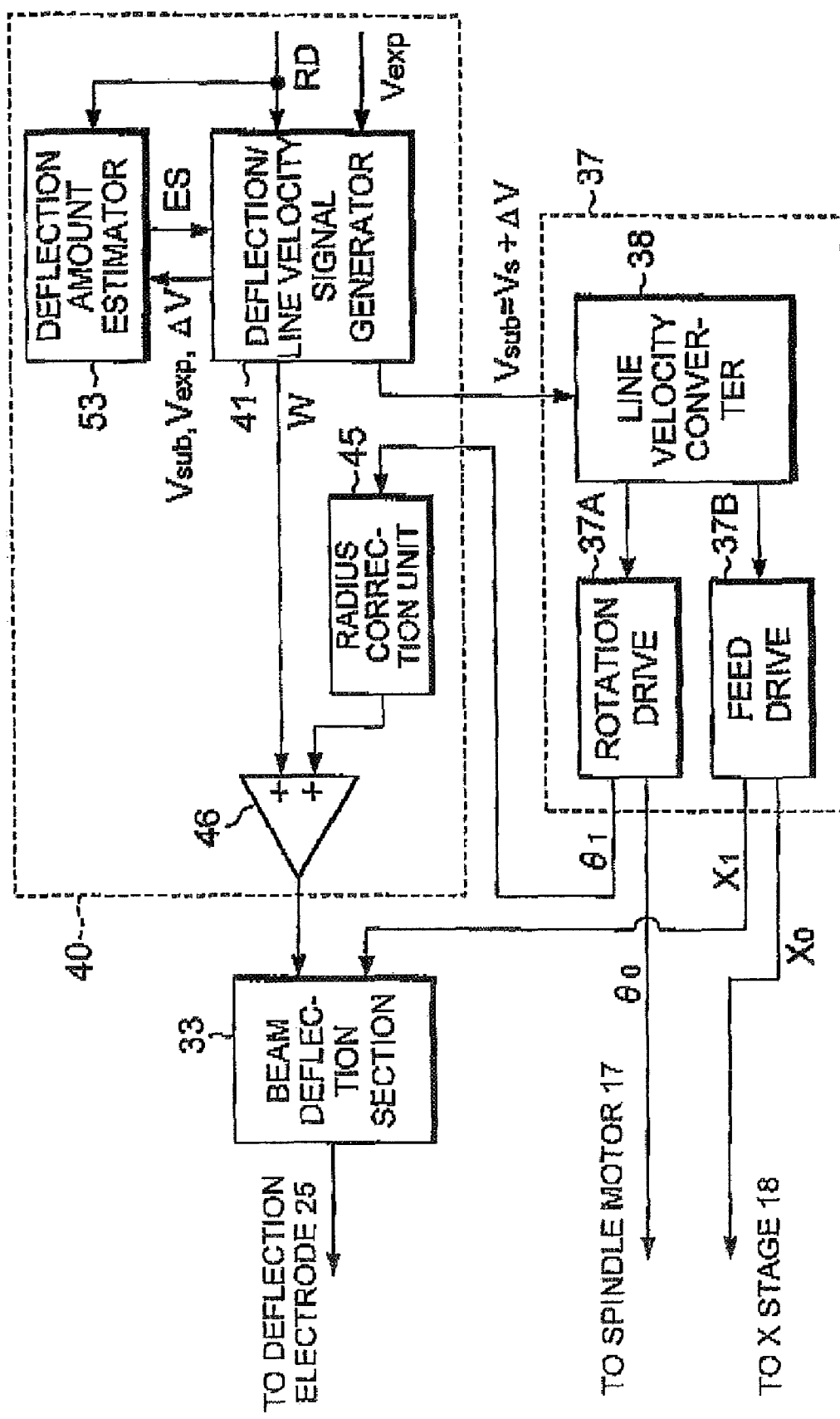
FIG. 11 is a block diagram showing an example of a detailed configuration of the control system according to Embodiment 4.

FIG. 11 is a block diagram showing an example of the detailed configuration of the control system according to Embodiment 4, and the portion of the control system for performing deflection control of the beam and position control of the substrate 15 is shown in detail.

In the present embodiment, a deflection amount estimation unit 53 is provided. The deflection amount estimation unit 53 loads a data sequence in a predetermined block of the recording data RD, and estimates the beam deflection amount for recording the data sequence, based on the current substrate velocity Vsub, the beam deflection velocity Vbeam and ΔV. The de-Election amount estimation unit 53 supplies a signal ES indicating the estimation value to a deflection/linear velocity signal generator 41. The deflection/linear velocity signal generator 41 determines a beam deflection velocity Vbeam, substrate velocity Vsub and adjustment value ΔV based on the estimation signal ES. More specifically, the deflection velocity Vbeam, substrate velocity Vsub and adjustment value ΔV are determined so that the beam deflection amount does not exceed the range in which the blanking of the electron beam is required. Or these values are determined so that the throughput of the electron beam exposure becomes high. Then based on the determination result, the beam deflection signal W and the substrate linear velocity signal Vsub are generated. The deflection/linear velocity signal generator 41 delays the above mentioned recording of the data sequence by the period required for the deflection estimation unit 53 loading the data sequence, and at least executing estimation on the data sequence. A delay unit (not illustrated) for delaying the input of the data sequence to the deflection/linear velocity signal generator 41 may be provided in the configuration.

By this control, the probability of requiring the blanking of the electron beam can be decreased, the loss of the electron beam can be decreased, and throughput of the electron beam exposure can be improved. Also a recording device with high throughput can be provided with a simple circuit configuration.

Embodiment 5

Figure 12:
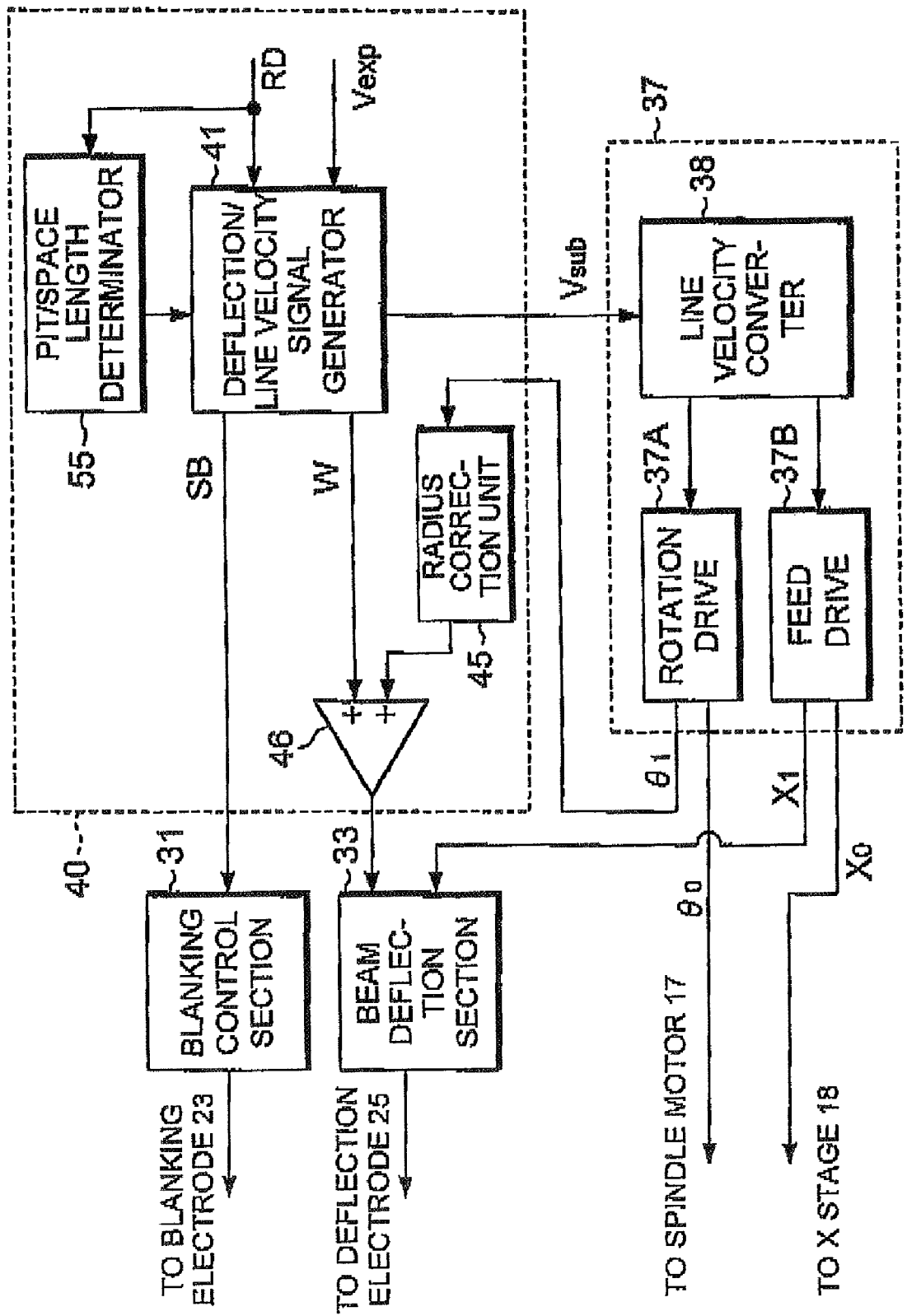
FIG. 12 is a block diagram showing an example of a detailed configuration of the control system according to Embodiment 5.

FIG. 12 is a block diagram showing an example of the detailed configuration of the control system according to Embodiment 5, and the portion of the control system for performing deflection control of the beam and the position control of the substrate 15 is shown in detail. In the present embodiment, a pit/space length determination unit 55 is provided. The rest is the same as the configuration of the above mentioned embodiments.

Figure 13:
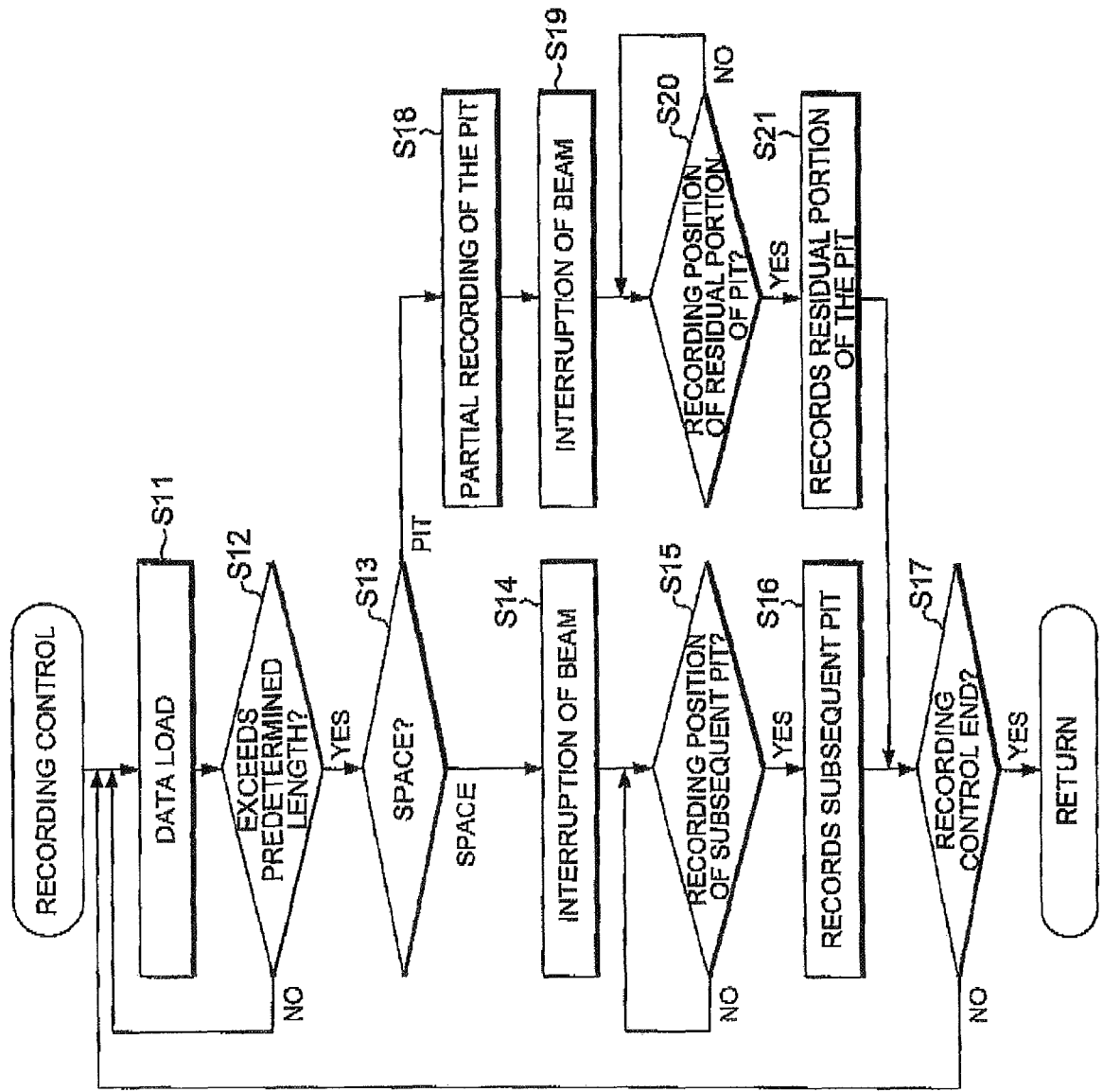
FIG. 13 is a flow chart showing a procedure to determine pit and space lengths and perform recording control.

The pit/space length determination unit 55 monitors the recording data RD, and determines whether a pit or space which exceeds a predetermined length is included in the recording data RD. Now a procedure to determine pit and space lengths and perform recording control will be described in details with reference to the flowchart in FIG. 13.

The pit/space length determination unit 55 sequentially loads the recording data RD (step S11) and determines whether the pit or space exceeds a predetermined length (step S12). If the pit or space does not exceed the predetermined length, processing returns to step S11, and repeats data load and determination.

If it is determined that the pit or space exceeds the predetermined length in step S12, then whether this is a pit or space is determined (step S13). If it is determined that this is a space which exceeds the predetermined length, the beam is interrupted (step S14). Then the pit/space length determination unit 55 waits for the arrival of the timing when a pit, subsequent to the space, is recorded (step S15). In other words, the pit/space length determination unit 55 waits until the substrate rotates up to the relative positions of the column and substrate where the start of recording of the subsequent pit is the optimum, such as a position at which the beam deflection angle is zero, or the deflection amount is within the predetermined range. The beam is turned ON according to the recording timing, and the subsequent pit is recorded (step S16).

Then whether recording control ends or not is determined (step S17), and if recording control is continued, processing returns to step S11, and the above procedure is repeated.

If it is determined that this is a pit which exceeds the predetermined length in step S13, a portion of the pit is recorded (step S18). Then the beam is interrupted (step S19), and the pit/space length determination unit 55 waits for the arrival of the timing when the residual portion of this pit (unrecorded portion) is recorded (step S20). In other words, the pit/space length determination unit 55 waits until the substrate rotates up to the relative positions of the column and substrate where the start of recording of the residual portion of the pit is the optimum. The beam is turned ON according to this recording timing, and the residual portion of the pit is recorded (step S21). In other words, the pit is divided and recorded in step S18 and step S21, and the dividing position is determined such that the beam deflection angle or deflection amount does not exceed the predetermined angle. The case of dividing into 2 portions was described, but if the pit is very long, the pit may be divided into 3 or more portions and recorded by repeating steps S18-S21. Then whether recording control ends or not is determined (step S17), and if recording control is continued, processing returns to step S11, and the above procedure is repeated.

As mentioned above, a recording device with high throughput can be provided by changing the beam deflection velocity and the substrate velocity (linear velocity), and at the same time interrupting the beam if it becomes necessary to record a long pit or space.

As described with various embodiments, the present invention can provide a beam recording device with which beam current is not lost, and high precision and high throughput are implemented.

The beam recording device using an electron beam was described, but the present invention can be applied to a laser beam recording device having a deflection device, or other charged particle beam recording devices.

The beam recording device is not limited to the beam recording device using an Xθ stage system, but the present invention can also be applied to a beam recording device having an XY stage system.

The invention clamed is:

1. A recording device for forming a latent image on a resist layer formed on a substrate by irradiating an exposure beam on the resist layer in accordance with recording signals while moving the substrate, comprising:
    a beam deflection section for relatively moving an irradiation position of the exposure beam with respect to the substrate;
    a deflection control section for performing control to change the deflection velocity of the exposure beam during exposure of the recording signals according to a moving velocity of the substrate,
    a detector for detecting a deflection angle of the exposure beam when forming the latent image, and
    a substrate velocity adjustment section for adjusting the moving velocity of the substrate based on a detected deflection angle detected by the detector.

2. The recording device according to claim 1, further comprising a low pass filter circuit for extracting a frequency component that is not more than a high cut-off frequency for mechanical response of a substrate moving stage wherein the substrate velocity adjustment section adjusts the moving velocity of the substrate according to the extracted frequency component.

3. The recording device according to claim 1, further comprising a deflection angle determination unit for determining whether the deflection angle of the exposure beam exceeds a predetermined range, wherein the substrate velocity adjustment section switches the moving velocity of the substrate to a predetermined velocity when a determination is made that the deflection angle exceeds the predetermined range.

4. The recording device according to claim 1, further comprising an estimation unit for estimating the deflection angle of the exposure beam based on the recording signals, wherein the substrate velocity adjustment section adjusts the moving velocity of the substrate based on an estimated value by the estimation unit.

5. The recording device according to claim 1, further comprising a determination unit for determining whether the deflection angle of the exposure beam exceeds a predetermined range based on a pit length and space length of the recording signals, and an irradiation adjuster for interrupting the exposure beam and adjusting an irradiation start position of the exposure beam when judgment is made that the deflection angle exceeds the predetermined range.

6. The recording device according to claim 1, wherein the substrate velocity adjustment section and the deflection control section increase the moving velocity of the substrate and the deflection velocity of the exposure beam, respectively, when the deflection angle of the exposure beam exceeds a predetermined value, the deflection angle being in the direction opposite to the direction of the movement of the substrate.

7. The recording device according to claim 1, wherein the substrate is moved by rotating the substrate.

8. The recording device according to claim 1, wherein a relative velocity of the substrate and the exposure beam is more than a predetermined value when forming the latent image.

9. A recording device for forming a latent image on a resist layer formed on a substrate by irradiating an exposure beam on the resist layer in accordance with recording signals while moving the substrate, comprising:
    a beam deflection section for relatively moving an irradiation position of the exposure beam with respect to the substrate;
    a deflection control section for performing control to change the deflection velocity of the exposure beam during exposure of the recording signals according to a moving velocity of the substrate,
    a detector for detecting a deflection angle of the exposure beam on the basis of a duty ratio of the recording signal when forming the latent image, and
    a substrate velocity adjustment section for adjusting the moving velocity of the substrate based on a detected deflection angle detected by the detector.

10. The recording device according to claim 9, further comprising a duty ratio determination unit for determining a duty ratio of a pit of the recording signal, wherein the substrate velocity adjustment section switches the moving velocity of the substrate to a faster value when judgment is made that the duty ratio of the pit is less than a predetermined lower limit value, and switches the moving velocity of the substrate to a slower value when judgment is made that the duty ratio of the pit exceeds a predetermined upper limit value.

11. The recording device according to claim 9, wherein the substrate velocity adjustment section and the deflection control section increase the moving velocity of the substrate and the deflection velocity of the exposure beam, respectively, when the deflection angle of the exposure beam exceeds a predetermined value, the deflection angle being in the direction opposite to the direction of the movement of the substrate.

12. The recording device according to claim 9, wherein the substrate is moved by rotating the substrate.

13. The recording device according to claim 9, wherein a relative velocity of the substrate and the exposure beam is more than a predetermined value when forming the latent image.

14. A recording method for forming a latent image on a resist layer formed on a substrate by irradiating an exposure beam on the resist layer in accordance with recording signals while moving the substrate, the method comprising steps of:
   relatively moving an irradiation position of the exposure beam with respect to the substrate;
   performing control to change the deflection velocity of the exposure beam during exposure of the recording signals according to a moving velocity of the substrate,
   detecting a deflection angle of the exposure beam when forming the latent image, and
   adjusting the moving velocity of the substrate based on a detected deflection angle detected in the detecting step.

15. The recording method according to claim 14, wherein the adjusting step and the performing control step increase the moving velocity of the substrate and the deflection velocity of the exposure beam, respectively, when the deflection angle of the exposure beam exceeds a predetermined value, the deflection angle being in the direction opposite to the direction of the movement of the substrate.

16. The recording device according to claim 14, wherein the substrate is moved by rotating the substrate.

17. The recording method according to claim 14, wherein a relative velocity of the substrate and the exposure beam is more than a predetermined value when forming the latent image.

18. A recording method for forming a latent image on a resist layer formed on a substrate by irradiating an exposure beam on the resist layer in accordance with recording signals while moving the substrate, the method comprising steps of:
   relatively moving an irradiation position of the exposure beam with respect to the substrate;
   performing control to change the deflection velocity of the exposure beam during exposure of the recording signals according to a moving velocity of the substrate,
   detecting a deflection angle of the exposure beam on the basis of a duty ratio of the recording signal when forming the latent image, and
   adjusting the moving velocity of the substrate based on a detected deflection angle detected in the detecting step.

19. The recording method according to claim 18, wherein the adjusting step and the performing control step increase the moving velocity of the substrate and the deflection velocity of the exposure beam, respectively, when the deflection angle of the exposure beam exceeds a predetermined value, the deflection angle being in the direction opposite to the direction of the movement of the substrate.

20. The recording device according to claim 18, wherein the substrate is moved by rotating the substrate.

21. The recording method according to claim 18, wherein a relative velocity of the substrate and the exposure beam is more than a predetermined value when forming the latent image.

* * * * *